United States Patent
Ginwalla et al.

(10) Patent No.: US 11,048,413 B2
(45) Date of Patent: Jun. 29, 2021

(54) METHOD FOR REDUCING READ PORTS AND ACCELERATING DECOMPRESSION IN MEMORY SYSTEMS

(71) Applicant: Samsung Electronics Co., Ltd., Suwon-si (KR)

(72) Inventors: Huzaifa S. Ginwalla, San Carlos, CA (US); Ramdas P. Kachare, Pleasanton, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 16/539,842

(22) Filed: Aug. 13, 2019

(65) Prior Publication Data
US 2020/0393970 A1   Dec. 17, 2020

Related U.S. Application Data

(60) Provisional application No. 62/860,619, filed on Jun. 12, 2019.

(51) Int. Cl.
*G06F 12/00*   (2006.01)
*G06F 3/06*   (2006.01)

(52) U.S. Cl.
CPC .......... *G06F 3/0608* (2013.01); *G06F 3/0659* (2013.01); *G06F 3/0661* (2013.01); *G06F 3/0673* (2013.01)

(58) Field of Classification Search
CPC .... G06F 3/0608; G06F 3/0659; G06F 3/0661; G06F 3/0673
See application file for complete search history.

(56) References Cited

U.S. PATENT DOCUMENTS

| | | | |
|---|---|---|---|
| 5,961,617 A * | 10/1999 | Tsang | G06F 1/3218 |
| | | | 345/555 |
| 6,961,057 B1 * | 11/2005 | Van Dyke | G06T 15/405 |
| | | | 345/422 |
| 2003/0217206 A1 * | 11/2003 | Poo | G06F 3/0607 |
| | | | 710/68 |
| 2006/0056406 A1 | 3/2006 | Bouchard et al. | |
| 2009/0103125 A1 * | 4/2009 | Awata | H04N 19/44 |
| | | | 358/1.15 |
| 2011/0131375 A1 | 6/2011 | Noeldner et al. | |
| 2011/0238917 A1 | 9/2011 | Lin et al. | |
| 2011/0276932 A1 * | 11/2011 | Baumgartner | G06F 30/327 |
| | | | 716/106 |
| 2013/0290615 A1 * | 10/2013 | Shah | G06F 3/0679 |
| | | | 711/103 |
| 2013/0339689 A1 | 12/2013 | Srinivasan et al. | |

(Continued)

*Primary Examiner* — Prasith Thammavong
(74) *Attorney, Agent, or Firm* — Lewis Roca Rothgerber Christie LLP

(57) ABSTRACT

A decompression system includes a first memory including a first write port configured to receive decompressed data from a decompressor, and a first read port configured to receive a back-reference read request, the first memory being configured to output the decompressed data to the decompressor in response to receiving the back-reference read request at the first read port, and a second memory including a second write port electrically coupled to the first write port and configured to receive the decompressed data, the second memory being configured to buffer the decompressed data for retrieval by a receiver.

20 Claims, 4 Drawing Sheets

(56) References Cited

U.S. PATENT DOCUMENTS

2016/0283159 A1    9/2016  Gopal et al.
2017/0269851 A1*  9/2017  Oportus Valenzuela ................... G06F 3/0659
2018/0088829 A1*  3/2018  Shankar .............. G06F 12/0895

* cited by examiner

METHOD FOR REDUCING READ PORTS AND ACCELERATING DECOMPRESSION IN MEMORY SYSTEMS

CROSS-REFERENCE TO RELATED APPLICATION(S)

This application claims priority to, and the benefit of, U.S. Provisional Application No. 62/860,619 ("METHOD FOR MINIMIZING NUMBER OF READ PORTS AND ACCELERATING READ OUT OF DECOMPRESSED DATA"), filed on Jun. 12, 2019, the entire content of which is incorporated herein by reference.

FIELD

Aspects of embodiments of the present disclosure are generally related to a memory decompression system.

BACKGROUND

Currently, the field of computing appears to be generally experiencing an increase of data. For example, in certain applications, such as video processing, generated data appears to be growing at an exponential rate. This rate of data growth has, in some cases, outpaced the increase in capacity of storage systems. Therefore, many computational systems store data in compressed form. As stored data may need to be consumed in uncompressed form, there is a need to decompress the stored data before it can be further processed.

SUMMARY

The present disclosure is generally directed to a decompression system capable of providing full-performance reads during decompression operations by maintaining a separate memory (i.e., a decompression write buffer) in parallel with a dual port memory (i.e., a dictionary memory) with one read port and one write port.

According to some embodiments of the present disclosure, there is provided a decompression system including: a first memory including: a first write port configured to receive decompressed data from a decompressor, and a first read port configured to receive a back-reference read request, the first memory being configured to output the decompressed data to the decompressor in response to receiving the back-reference read request at the first read port; and a second memory including: a second write port electrically coupled to the first write port and configured to receive the decompressed data, the second memory being configured to buffer the decompressed data for retrieval by a receiver.

In some embodiments, the second memory further includes: a second read port configured to receive an uncompressed data readout request, and configured to supply the decompressed data to the receiver in response to the uncompressed data readout request.

In some embodiments, the decompression system further includes: a controller configured to generate the back-reference read request and the uncompressed data readout request.

In some embodiments, an output of the first memory is coupled to the decompressor, and an output of the second memory is coupled to the receiver.

In some embodiments, the first memory is configured to operate independently of the second memory.

In some embodiments, the first memory includes a dictionary memory configured to store dictionary values from a compression process performed on stored data decompressed by the decompressor, and the second memory includes an uncompressed mirror write buffer.

In some embodiments, a storage capacity of the second memory is less than that of the first memory.

In some embodiments, the storage capacity of the second memory is based on a data rate mismatch between an input data rate of the receiver and an output date rate of the decompressor.

According to some embodiments of the present disclosure, there is provided a memory system including: a receiver; a compressed-data memory configured to store compressed data; a decompressor configured to retrieve the compressed data from the compressed-data memory and to generate decompressed data in response to a request from the receiver; a first memory including: a first write port configured to receive the decompressed data from the decompressor; and a first read port configured to receive a back-reference read request, the first memory being configured to output the decompressed data to the decompressor in response to receiving the back-reference read request at the first read port; and a second memory including: a second write port electrically coupled to the first write port and configured to receive the decompressed data, the second memory being configured to buffer the decompressed data for retrieval by the receiver.

In some embodiments, the second memory further includes: a second read port configured to receive an uncompressed data readout request, and configured to supply the decompressed data to the receiver in response to the uncompressed data readout request.

In some embodiments, the memory system of claim 10, further includes: a controller configured to generate the back-reference read request and the uncompressed data readout request, the controller including a reconfigurable processor.

In some embodiments, an output of the first memory is coupled to the decompressor, and an output of the second memory is coupled to the receiver.

In some embodiments, the first memory is configured to operate independently of the second memory.

In some embodiments, the first memory includes a dictionary memory configured to store dictionary values from a compression process performed on compressed data stored at the compressed-data memory, and the second memory includes an uncompressed mirror write buffer.

In some embodiments, a storage capacity of the second memory is less than that of the first memory.

In some embodiments, the storage capacity of the second memory is based on a data rate mismatch between an input data rate of the receiver and an output date rate of the decompressor.

In some embodiments, the decompressor is configured to decompress subsequent compressed data from the compressed-data memory based on the decompressed data stored at the first memory.

According to some embodiments of the present disclosure, there is provided a method of decompressing stored data in a memory system, the method including: instructing a decompressor to decompress stored data at a compressed-data memory to generate decompressed data, the stored data being in compressed form; writing the decompressed data to a first memory and a second memory; sending a back-reference read request to the first memory, the first memory being configured to output the decompressed data to the decompressor in response to the back-reference read request; and sending an uncompressed data readout request to the second memory, the second memory being configured to output the decompressed data to a receiver in response to the uncompressed data readout request.

In some embodiments, an output of the first memory is coupled to the decompressor, and an output of the second memory is coupled to the receiver.

In some embodiments, the first memory is configured to operate independently of the second memory.

BRIEF DESCRIPTION OF THE DRAWINGS

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims. The accompanying drawings, together with the specification, illustrate example embodiments of the present disclosure, and, together with the description, serve to explain the principles of the present disclosure.

DETAILED DESCRIPTION

The detailed description set forth below is intended as a description of example embodiments of a system and method for decompression, provided in accordance with the present disclosure, and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

As the volume of data continues to grow, it is desirable for storage systems to store data in compressed form. However, as data generators and data consumers produce and consume data in uncompressed form, storage solutions rely, ever more, on compression and decompression techniques. However, the compression and decompression may place greater computational demands on systems relying on this form of storage and may drive up power consumption and introduce latency (e.g., data retrieval latency).

The present disclosure is generally directed to a decompression system and a memory system that provide relatively high-throughput and low-latency read capability, as well as lower power consumption, during memory decompression.

Figure 1:
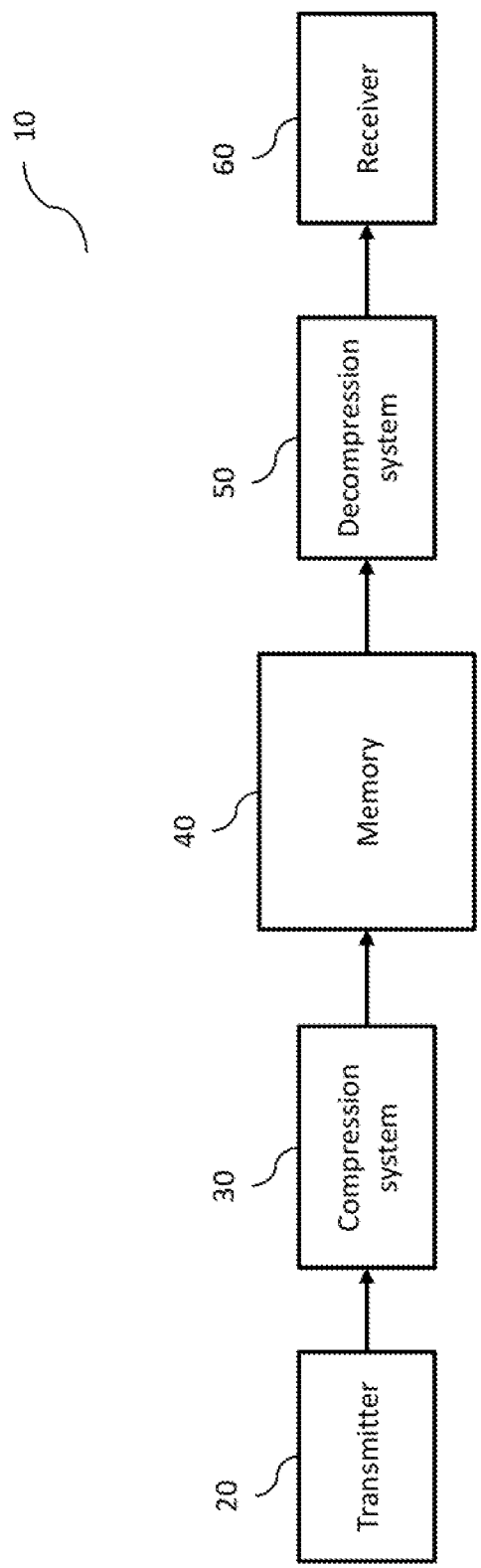
FIG. 1 shows a block diagram illustrating a memory system, according to some example embodiments of the present disclosure.

FIG. 1 shows a block diagram illustrating a memory system 10, according to some example embodiments of the present disclosure.

Referring to FIG. 1, the memory system 10 includes a transmitter 20, a compression system 30, a memory (e.g., a compressed-data memory) 40, a decompression system 50, and a receiver 60. The transmitter 20 and the receiver 60 can process data in uncompressed form. However, in some examples, large size data may be transferred between the transmitter 20 and the receiver 60. Accordingly, due to the limited capacity of the memory 40 used to store such data, the memory system 10 may compress the data prior to storing the data at the memory 40. Later, the memory system 10 may decompress the stored data when the receiver 60 makes a read request for the stored information.

In some examples, the memory system 10 may be a graphical processing system, the transmitter 20 may include an image frame buffer, the data from the transmitter 20 may include image data undergoing processing by the graphical processing system, the memory 40 may include an on-chip L2 cache of the graphical processing unit, and the receiver 60 may include a further processing unit such as a texture unit. However, embodiments of the present disclosure are not limited thereto. For example, in a storage device, the transmitter and receiver 20 and 60 may represent host processes (e.g., user or system processes of a host computer) and the memory 40 may be a non-volatile memory device, such as a solid state drive (SSD), a hard disk drive (HDD), or the like. In some examples, the receiver 60 may include an external storage device.

The compression system 30 may perform compression (e.g., fixed or variable rate compression) on blocks of data (e.g., texture blocks) received from the transmitter 20. The compression system 30 may do so by analyzing the blocks of data; for each individual block of data, independently determining an associated data type (e.g., a flat data type, a planar data type, a wavelet data type, a spline data type, etc.) and an associated compression type; and compressing each data block according to the associated compression type. This compressed data is then stored in the memory 40. When the receiver 60 requests the uncompressed data corresponding to a stored compressed data, the decompression system 50 decompresses the stored compressed data using meta data and dictionary values generated by the compression system 30 during compression and provides the uncompressed data to the receiver 60.

Figure 2:
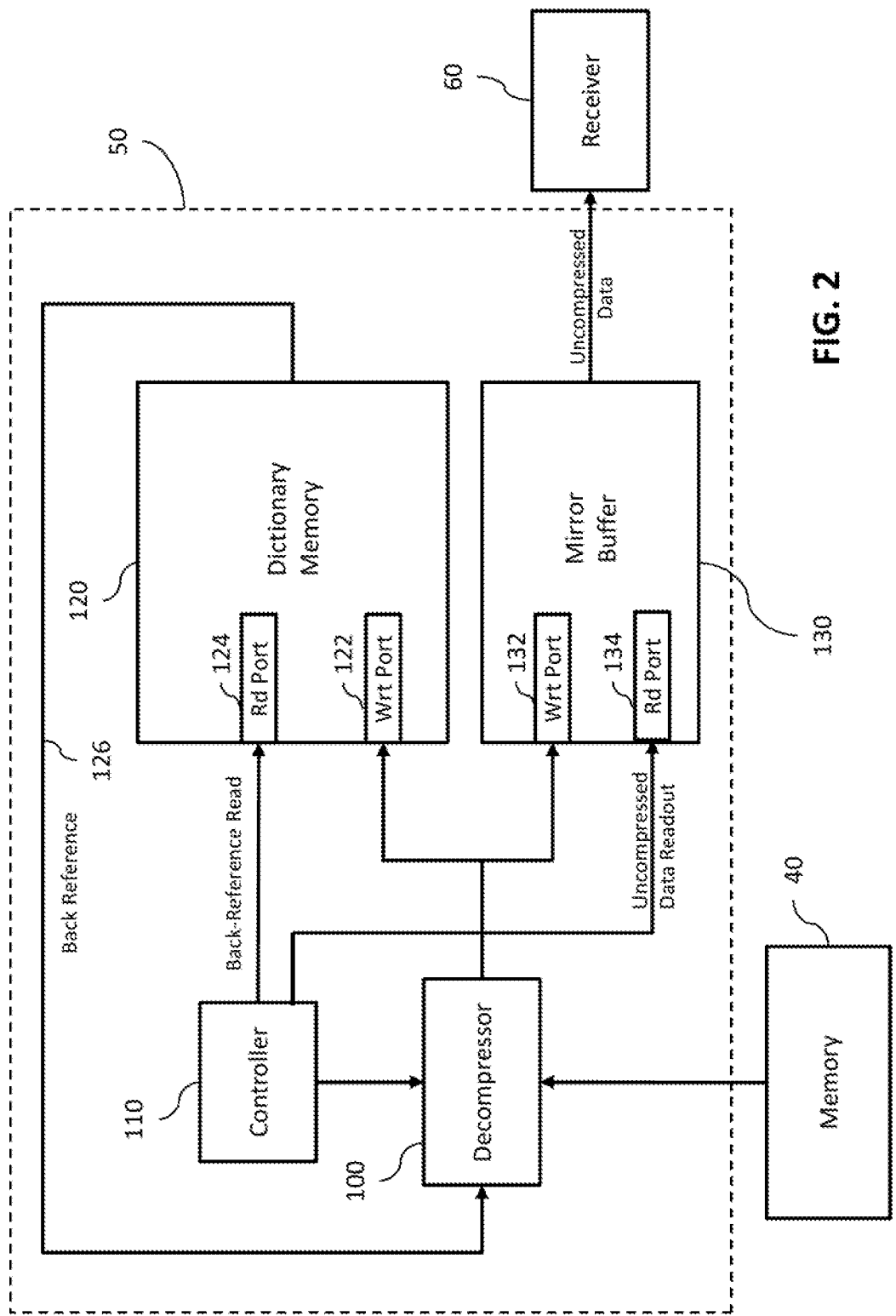
FIG. 2 shows a block diagram illustrating a memory decompression system, according to some example embodiments of the present disclosure.
Figure 3:
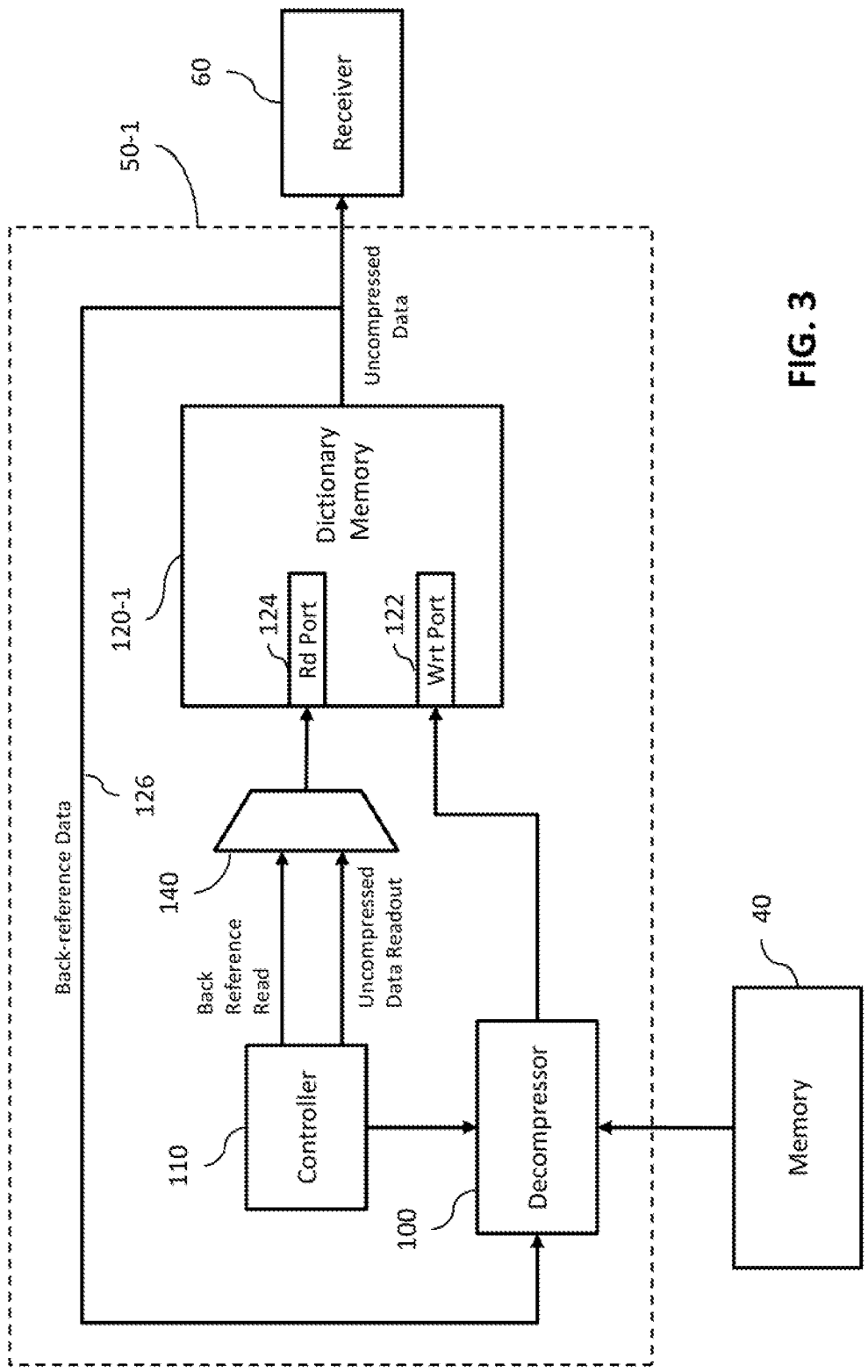
FIG. 3 shows a block diagram illustrating a comparative decompression system, according to some example embodiments of the present disclosure.

FIG. 2 shows a block diagram illustrating a decompression system 50, according to some example embodiments of the present disclosure. FIG. 3 shows a block diagram illustrating a comparative decompression system 50-1, according to some example embodiments of the present disclosure.

Referring to FIG. 2, the decompression system 50 can include a decompressor 100, a controller (e.g., a decompression controller) 110, a first memory (e.g., a dictionary memory) 120, and a second memory (e.g., uncompressed mirror write buffer) 130. The first memory 120 may be separate from (e.g., as separate memory dies), and may be configured to operate (e.g., process read and write requests) independently of, the second memory 130. Each of the first and second memories 120 and 130 may have a single write port and a single read port through which data and requests are received (e.g., from the decompressor 100). The output of the first memory 120 may be coupled to the decompressor 100 and may not be coupled to the receiver 60. Further, the output of the second memory 130 may be coupled to the receiver 60 and may not be coupled to the decompressor 100. The read and write operations of the first and second memory 120 and 130 may be controlled by the controller 110. The controller may include a reconfigurable processor, such as a field-programmable gate array (FPGA), an application-specific integrated circuit (ASIC), or the like.

In some embodiments, the first memory 120 may include a dictionary memory that stores dictionary values from the compression process performed by the compression system 30. The dictionary values may represent compression patterns in the compressed data that can be used by the decompressor for decompressing the stored data. In other words, the compression process locates a pattern or string of values repeated in the input dataset. Such detected repeat patterns are encoded in the compressed output to have one reference copy of the detected pattern and then references to that copy for all subsequent occurrences of that pattern in the input dataset. According to some examples, a dictionary value may include a single instance of compressed data for duplicate data blocks, one or more values representative of a block of pixel data (such as a single value representing a flat pixel block), combinations thereof, and/or the like. As an example, when, in a text input dataset, the string "big dog" appeared 5 times, the compressed output for such input may contain "big dog" copied as is for the first instance, and the remaining four instances may be encoded as reference to the "big dog". Hence five occurrences of the "big dog" pattern in the input dataset would be reduced to one "big dog" pattern and four reference pointers, thus achieving a large reduction in the compressed output size relative to the input dataset size. In other words, by encoding repeated patterns in the input datasets in terms of back reference pointers, a compressor may achieve large compression ratios. The first memory 120 may also store the decompressed date generated by the decompressor 100, which may be relied on, by the decompressor 100, to generate subsequent decompressed data. Thus, in some embodiments, the output of the first memory 120 may be coupled to the decompressor 100 through a feedback line 126.

According to some embodiments, the second memory 130 may serve as a transit buffer that can temporarily store the decompressed data generated by the decompressor 100 for later retrieval by the receiver 60. The storage capacity of the second memory 130 may be less than that of the first memory 120, as the second memory 130 may not store any dictionary values and may be configured to store (e.g., to only store) recently decompressed data. Thus, the capacity of the second memory 130 may be equal to the quantity of data transferred to the receiver 60. In some examples, the capacity of the second memory may be determined by the data rate mismatch between the input data rate of the receiver 60 and the output date rate of the decompressor 100. The capacity of the second memory may depend on the amount of burst buffering associated with a particular design implementation. For example, the receiver 60 may process data at a slower rate than the throughput of the decompressor 100. In such an example, the decompression system 50 may produce data outputs and buffer them in the second memory 130 until the receiver 60 is ready to read that data. Thus, the decompression system 50 may implement a certain amount of burst buffering in the form the second memory 130 that allows the decompression system 50 to continue its operation even though the consumer of the data (i.e., the receiver) may be operating at slower pace. Here, the fixed size of the second memory 130 can make it independent of the block size associated with the compression scheme. The block size may aid in reducing overall memory resource usage for the decompression system. By decoupling dictionary storage in the form of the first memory 120 and the output of the decompression system 50, the second memory 130 also improves latency of the uncompressed output data sent to the consumer of that data (i.e., the receiver 60).

In response to a data request from the receiver 60, the decompressor 100 decompresses compressed data stored in the memory 40. Accordingly, the decompressor 100 can send the decompressed data to both of the first and second memories 120 and 130. In so doing, the controller 110 may interprets the compressed data stored at the memory 40 by decoding the metadata included in the compressed data. The compression metadata may indicates how to generate or produce subsequent decompressed output data. In some examples, this may involve copying a pattern directly from the compressed data to the decompressed data or copying certain pattern from the earlier decompressed data output. In a first example, the metadata may indicate to copy the current 8 bytes in the input dataset, as is, to the uncompressed output. In a second example, metadata may indicate to copy 16 bytes from a particular location in the previously uncompressed data. In the first example, the controller 110 may perform a direct write to the first and second memories 120 and 130. In the second example, the controller 110 may first read the appropriate location in the previously decompressed data (e.g., through a back reference operation) and then write that data to the appropriate location in both the first and second memories 120 and 130. This decompressed data can be concurrently received (e.g., simultaneously received) by the respective write ports 122 and 132 of the memories 120 and 130, which are electrically coupled (e.g., tied) together. According to some embodiments, the controller 110 controls and initiates the writing of uncompressed data to both of the memories 120 and 130.

In some examples, when decompressing data stored on the memory 40, the decompressor 100 may use previously decompressed data as a reference. According to some embodiments, the controller 110 may send a back-reference read signal (also referred to as a back-reference read request) to the read port 122 of the first memory 120, which signals to the first memory 120 to output most recent decompressed data back to the decompressor 100 for back-referencing. Further, the controller 110 can maintain the second memory 130 and can send an uncompressed data readout request to the read port 134 to instruct the second memory 130 to release (e.g., output) the buffered decompressed data to the receiver 60. Further, the data retrieval operation of the second memory 130 may be decoupled from the back-reference operation of the first memory 120 and the decompressed data can be made available to the receiver 60 requesting the uncompressed data as the stored data is uncompressed.

In some examples, the process for retrieving uncompressed data and sending to the receiver 60 may not access the first memory 120; thus, the bandwidth of the read port 124 may be dedicated to the decompression process which reads from back-referenced data (e.g., the uncompressed data stored at the first memory 120).

By sending the back-reference read request and the uncompressed data readout request to two separate read ports of two independent memories, both of the back-reference and uncompressed data readout operations can be performed concurrently (e.g., simultaneously) with relatively low, deterministic latency, which may improve (e.g., increases) the overall decompression rate of the decompression system 50.

This technique can be contrasted with a comparative example (see, FIG. 3) where both requests are sent to a single read port 124 of one dictionary memory 120-1. In such a comparative example, the two requests may undergo arbitration by the arbitrator (e.g., a multiplexer) 140 at the read port (e.g., using time-division multiplexing, round robin priority, strict priority, and/or the like), which can increase complexity of the decompression system. Further, such arbitration may introduce additional non-deterministic latency, as one operation would have to be completed before the other could be initiated. This may increase the device's computational use and reduce overall system performance. Further, by utilizing the first and second memories 120 and 130, which can include dual port memories (as opposed to multi-port memories), the decompression system can be implemented at a comparatively low cost. Additionally, having each of the memories 120 and 130 perform one task (as opposed to two) may reduce number of accesses to the device, reduce power consumption, and improve the system's overall robustness and reliability.

Figure 4:
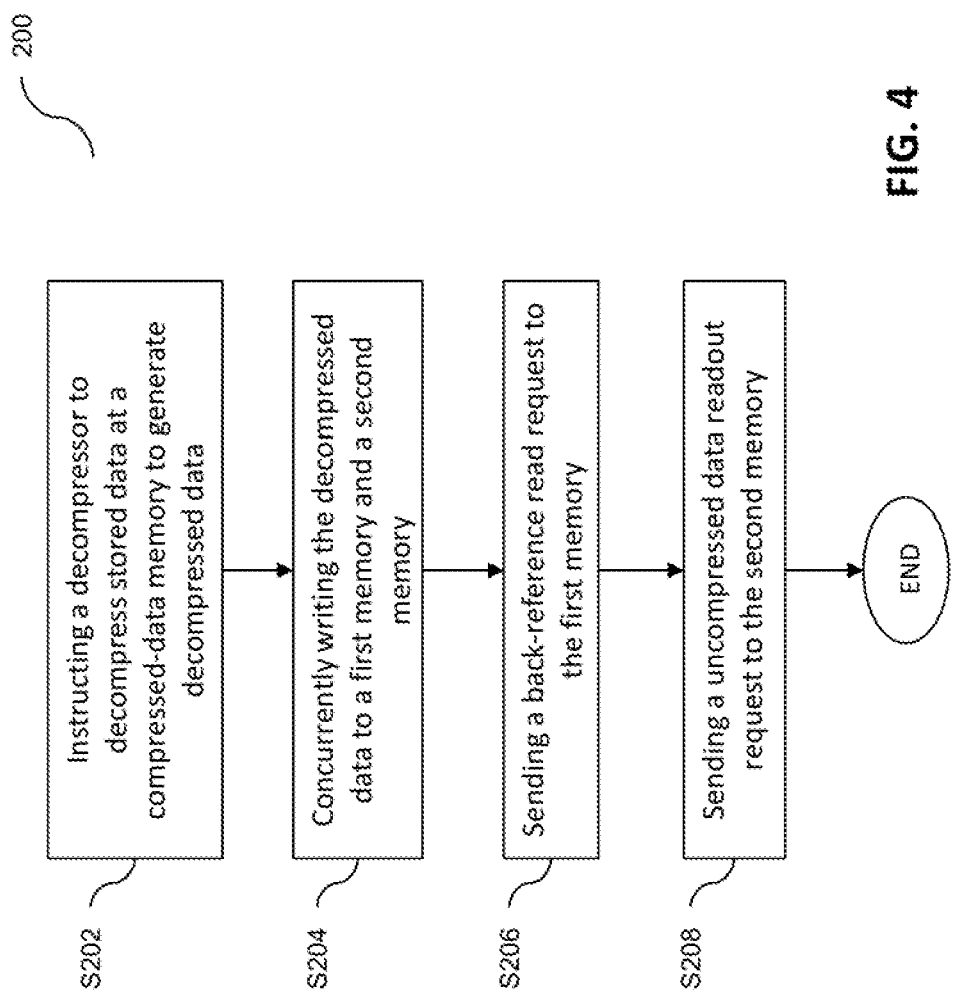
FIG. 4 shows a flow diagram illustrating example operations for decompressing stored data in a memory system, according to some example embodiments of the present disclosure.

FIG. 4 shows a flow diagram illustrating exemplary operations of a process 200 for decompressing stored data in a memory system, according to some example embodiments of the present disclosure.

Referring to FIG. 3, according to some embodiments, when the receiver 60 requests data that is stored in the memory 40 in compressed form, the controller 110 can instruct the decompressor 100 to decompress stored data to generate decompressed data (S202). The controller 110 may then concurrently write, via the decompressor 100, the decompressed data to the first memory 120 and the second memory 130 (S204). Before a subsequent stored data is decompressed, the controller 110 may send a back-reference read request to the first memory 120, which may prompt the first memory 120 to output the decompressed data to the decompressor 100 (S206). Additionally, the controller 110 can send an uncompressed data readout request to the second memory 130, which may prompt the second memory 130 to output the buffered decompressed data to the receiver 60.

Accordingly, as described above, the decompression system may reduce (e.g., minimizes) the number of ports required for memory that has the un-compressed data. Reading from the on-chip dictionary memory may not be required to send the data to the receiver/data consumer. This reduces the number of agents required to read the memory, which can lead to fewer read ports, no arbitration, and lower complexity. This reduction of agents can increase the overall decompression rate, reduce the latency of uncompressed data and provide a deterministic latency.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include", "including", "comprises", and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of the inventive concept". Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use", "using", and "used" may be considered synonymous with the terms "utilize", "utilizing", and "utilized", respectively.

The decompression system and/or any other relevant devices or components according to embodiments of the present disclosure described herein may be implemented by utilizing any suitable hardware, firmware (e.g., an application-specific integrated circuit), software, or a suitable combination of software, firmware, and hardware. For example, the various components of the independent multi-source display device may be formed on one integrated circuit (IC) chip or on separate IC chips. Further, the various components of the compression system may be implemented on a flexible printed circuit film, a tape carrier package (TCP), a printed circuit board (PCB), or formed on the same substrate. Further, the various components of the compression system may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer-readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present disclosure.

While this disclosure has been described in detail with particular references to illustrative embodiments thereof, the embodiments described herein are not intended to be exhaustive or to limit the scope of the disclosure to the exact forms disclosed. Persons skilled in the art and technology to which this disclosure pertains will appreciate that alterations and changes in the described structures and methods of assembly and operation can be practiced without meaningfully departing from the principles, and scope of this disclosure, as set forth in the following claims and equivalents thereof.

What is claimed is:

1. A decompression system comprising:
a first memory comprising:

a first write port configured to receive decompressed data from a decompressor, and
a first read port configured to receive a back-reference read request,
the first memory being configured to output the decompressed data to the decompressor in response to receiving the back-reference read request at the first read port; and
a second memory comprising:
a second write port electrically coupled to the first write port and configured to receive the decompressed data,
the second memory being configured to buffer the decompressed data for retrieval by a receiver.

2. The decompression system of claim 1, wherein the second memory further comprises:
a second read port configured to receive an uncompressed data readout request, and configured to supply the decompressed data to the receiver in response to the uncompressed data readout request.

3. The decompression system of claim 2, further comprising:
a controller configured to generate the back-reference read request and the uncompressed data readout request.

4. The decompression system of claim 1, wherein an output of the first memory is coupled to the decompressor, and
wherein an output of the second memory is coupled to the receiver.

5. The decompression system of claim 1, wherein the first memory is configured to operate independently of the second memory.

6. The decompression system of claim 1, wherein the first memory comprises a dictionary memory configured to store dictionary values from a compression process performed on stored data decompressed by the decompressor, and the second memory comprises an uncompressed mirror write buffer.

7. The decompression system of claim 1, wherein a storage capacity of the second memory is less than that of the first memory.

8. The decompression system of claim 7, wherein the storage capacity of the second memory is based on a data rate mismatch between an input data rate of the receiver and an output date rate of the decompressor.

9. A memory system comprising:
a receiver;
a compressed-data memory configured to store compressed data;
a decompressor configured to retrieve the compressed data from the compressed-data memory and to generate decompressed data in response to a request from the receiver;
a first memory comprising:
a first write port configured to receive the decompressed data from the decompressor; and
a first read port configured to receive a back-reference read request,
the first memory being configured to output the decompressed data to the decompressor in response to receiving the back-reference read request at the first read port; and
a second memory comprising:
a second write port electrically coupled to the first write port and configured to receive the decompressed data,
the second memory being configured to buffer the decompressed data for retrieval by the receiver.

10. The memory system of claim 9, wherein the second memory further comprises:
a second read port configured to receive an uncompressed data readout request, and configured to supply the decompressed data to the receiver in response to the uncompressed data readout request.

11. The memory system of claim 10, further comprising:
a controller configured to generate the back-reference read request and the uncompressed data readout request,
the controller comprising a reconfigurable processor.

12. The memory system of claim 10, wherein an output of the first memory is coupled to the decompressor, and wherein an output of the second memory is coupled to the receiver.

13. The memory system of claim 10, wherein the first memory is configured to operate independently of the second memory.

14. The memory system of claim 10, wherein the first memory comprises a dictionary memory configured to store dictionary values from a compression process performed on compressed data stored at the compressed-data memory, and the second memory comprises an uncompressed mirror write buffer.

15. The memory system of claim 10, wherein a storage capacity of the second memory is less than that of the first memory.

16. The memory system of claim 15, wherein the storage capacity of the second memory is based on a data rate mismatch between an input data rate of the receiver and an output date rate of the decompressor.

17. The memory system of claim 10, wherein the decompressor is configured to decompress subsequent compressed data from the compressed-data memory based on the decompressed data stored at the first memory.

18. A method of decompressing stored data in a memory system, the method comprising:
instructing a decompressor to decompress stored data at a compressed-data memory to generate decompressed data,
the stored data being in compressed form;
writing the decompressed data to a first memory and a second memory;
sending a back-reference read request to the first memory,
the first memory being configured to output the decompressed data to the decompressor in response to the back-reference read request; and
sending an uncompressed data readout request to the second memory,
the second memory being configured to output the decompressed data to a receiver in response to the uncompressed data readout request.

19. The method of claim 18, wherein an output of the first memory is coupled to the decompressor, and wherein an output of the second memory is coupled to the receiver.

20. The method of claim 18, wherein the first memory is configured to operate independently of the second memory.

* * * * *